United States Patent [19]

Ishii et al.

[11] Patent Number: 5,260,128
[45] Date of Patent: Nov. 9, 1993

[54] ELECTROMAGNETIC SHIELDING SHEET

[75] Inventors: Hiroyoshi Ishii; Misao Kaneko, both of Kumagaya, Japan

[73] Assignee: Kabushiki Kaisha Riken, Tokyo, Japan

[21] Appl. No.: 708,002

[22] Filed: May 24, 1991

Related U.S. Application Data

[63] Continuation of Ser. No. 448,361, Dec. 11, 1989, abandoned.

[51] Int. Cl.⁵ .................. B32B 5/16; B32B 15/08; H05K 9/00
[52] U.S. Cl. ................ 428/328; 174/35 MS; 428/256; 428/329; 428/357; 428/458
[58] Field of Search ........... 428/256, 328, 329, 433, 428/458, 900; 174/35 R, 35 MS; 252/62.84; 368/293; 148/403

[56] References Cited

U.S. PATENT DOCUMENTS

| | | | |
|---|---|---|---|
| 4,150,981 | 4/1979 | O'Handley | 75/170 |
| 4,474,676 | 10/1984 | Ishino et al. | 252/62.54 |
| 4,632,250 | 12/1986 | Ueda et al. | 206/524.2 |
| 4,670,347 | 6/1987 | Lasik et al. | 428/458 |
| 4,695,515 | 9/1987 | Shirai et al. | 428/458 |
| 4,749,625 | 6/1988 | Obayashi et al. | 428/624 |
| 4,871,883 | 10/1989 | Guiol | 174/36 |
| 4,923,533 | 5/1990 | Shigeta et al. | 148/304 |
| 4,992,329 | 2/1991 | Ishii et al. | 428/328 |

Primary Examiner—George F. Lesmes
Assistant Examiner—Christopher Brown
Attorney, Agent, or Firm—Finnegan, Henderson, Farabow, Garrett & Dunner

[57] ABSTRACT

An electromagnetic shielding sheet comprising a combination of at least one amorphous alloy layer containing Co based amorphous alloy flakes, at least one electrical conductive metal layer, and an insulation layer therebetween. This sheet is effective in shielding instruments from electromagnetic waves of both low and high frequency.

8 Claims, 11 Drawing Sheets

ELECTROMAGNETIC SHIELDING SHEET

This application is a continuation of application Ser. No. 07/448,361, filed Dec. 11, 1984, now abandoned.

BACKGROUND OF THE INVENTION

This invention relates to an electromagnetic shielding sheet.

Due to the increasing wide use of electrical and electronic instruments, synthetic resin (plastic) materials have been used to make the cases for the instruments because of the resulting benefits in price and weight. However, the problem of leakage of electromagnetic waves emitted from instruments becomes greater year by year. Further, when precise electronic instruments such as computers and measuring devices are exposed to outside electromagnetic waves or radiations, erroneous operation or erroneous measurements may occur. Consequently, governments have established regulations for electromagnetic waves both in West Germany and United States of America, and such regulations are expected in the near future in Japan.

Various methods for shielding instruments from exposure to or from emitting electromagnetic waves have been proposed, but such methods have not been entirely satisfactory. For example, painting the cases of the instruments with conductive paints, or spraying them with melted zinc have been tried. Also plating, vapor depositing or sputtering shielding substances on the surfaces of the plastic casings of the instruments have been used to shield the electrical components. However, they have generally been ineffective for electromagnetic waves of low frequency, and there is also the problem of the shielding materials peeling off.

Stainless steel fibers have also been used to shield electromagnetic waves by mixing the metal fibers with the plastic materials used to make the cases for the instruments. However, this has not been entirely satisfactory either, because it is necessary to add considerable amounts of metal fibers into the plastic to obtain the desired shielding effect and this tends to degrade the strength of the plastic. It also makes it necessary to paint the instruments to cover over for the metal fibers appearing on its surface.

Iron foils have also been used as a shielding material but, an insufficient shielding effect is obtained with magnetic waves of low frequency. Also, when compared with copper and aluminum, the electric resistance is greater with waves of high frequency and the shielding characteristics are not good.

Therefore an object of this invention is to provide an electromagnetic shielding sheet for shielding electrical instruments from electromagnetic waves of both low and high frequency. Further, an object of this invention is to provide an electromagnetic shielding sheet which is flexible and easy to use.

SUMMARY OF THE INVENTION

The electromagnetic shielding sheet of the present invention is a laminated structure having at least one amorphous alloy layer containing soft magnetic Co based amorphous alloy flakes and at least one electrical conductive metal layer. More particularly, the sheet comprises at least one amorphous metal alloy layer made up of soft magnetic Co based amorphous alloy flakes containing a major proportion of Co, at least one electrical conductive metal layer and at least one insulation layer laminated between said metal layer and said alloy layer, said amorphous flakes each having a thickness of from 5-100 $\mu$m and aspect ratio of from 10 to 15,000 and being laminated onto one another to form said alloy layer at a rate of 100-500 g/m$^2$ and said electrical conductive metal layer being selected from a metal of the group consisting of Cu, Al, Ni and Fe and having a thickness of from 5-500 $\mu$m.

DETAILED DESCRIPTION OF THE INVENTION

Figure 1:
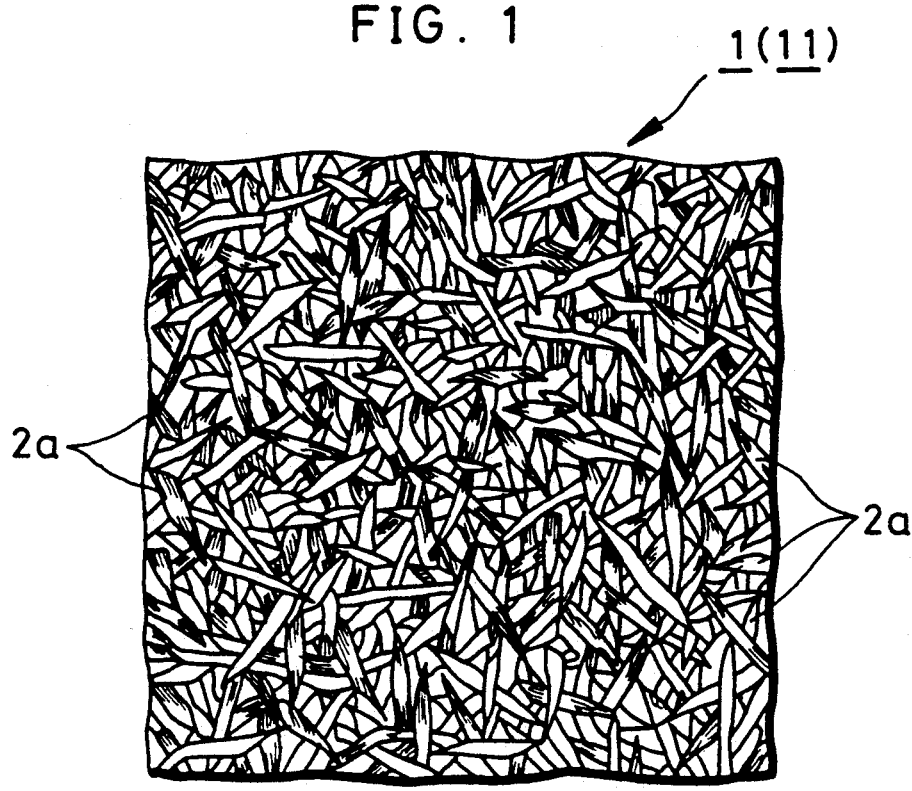
FIG. 1 is a plan view of an electromagnetic shielding sheet of the invention.

Amorphous alloys are usually only available in the form of ribbons of 10 $\mu$m in thickness and about 100 mm in width. However, difficulties are encountered in cutting the ribbon into the desired size and in also having to overlap each other. Moreover, several layers must be laminated together to obtain the desired thickness. In accordance with this invention, it has been found that excellent magnetic shielding sheets having theoretical characteristics of magnetic amorphous alloys can be obtained by using the magnetic amorphous alloy materials in the form of flakes and laminating them together.

Soft magnetic amorphous alloy flakes (hereinafter referred to as amorphous alloy flakes) of less than 5 $\mu$m or more than 100 $\mu$m thickness cannot be produced easily. Thus, the thickness of the amorphous alloy flakes is limited to the range of from 5-100 $\mu$m, preferably 20-60 $\mu$m. When the aspect ratio (ratio of maximum length to maximum thickness) of the amorphous alloy flakes is less than 10, the magnetic permeability of the flakes is lowered, and their magnetic property is changed. Additionally, the lamination process becomes more difficult and their magnetic shielding property is degraded. On the other hand, when the aspect ratio exceeds 15,000, the amorphous alloy flakes are difficult to use. Thus the range for the aspect ratio should be from 10 to 15,000 and more preferably from 50-10,000.

The amorphous alloy layer is produced by laminating the amorphous alloy flakes onto each other at a rate of from 100-500 g/m². When the amount of amorphous alloy flakes is less than 100 g/m², the magnetic shielding property is too low and the laminations between the amorphous alloy flakes become difficult. Also, when the amount exceeds 500 g/m², the magnetic shielding property is not good even though the amount of amorphous alloy flakes per m² is increased, because good adhesive contact of amorphous alloy flakes is difficult and voids or air spaces develop in the layer. Thus, the preferred amount of amorphous alloy flakes is 100 to 500 g/m² and more preferably from 200-350 g/m².

When the amorphous alloy layers have the structure described above and the amorphous alloy flakes have good soft magnetic properties, then the layers are effective in shielding electromagnetic waves of low frequency. However, the thickness of the amorphous alloy layer would have to be greater for electromagnetic waves of high frequency, and amorphous alloy layers have the disadvantage, when compared with conductive materials such as copper and aluminum, of having a low electric resistance. Electromagnetic waves of high frequency have to also be shielded but because the electric resistance of an amorphous metal layer is high (100-150 $\mu m\Omega.cm$), the layer would be too thick. Thus, electrically conductive materials having a low electric resistance should be used as the shield materials for electromagnetic waves of high frequency. However, these materials have almost no activity for electromagnetic waves of low frequency.

Thus, the sheets of the invention contain layers of amorphous alloy flakes and electrical conductive metal layers that are laminated together so that electromagnetic waves of both low and high frequency are effectively shielded, the amorphous alloy layers being used as the shielding layers for waves of low frequency and the electrical conductive metal layers as the shielding layers for the waves of high frequency.

However, the amorphous alloy layers should not be brought directly into contact with the conductive metal layers, because the interference of both of the layers might develop. Thus gaps need to be provided between both the layers by the insertion of an insulation material such as a plastic film between the two layers in the lamination process. When these gaps, that is, the thickness of the insulation materials, are less than 5 $\mu$m, there is too close a contact of the amorphous alloy layers and the conductive metal layers and when these gaps exceed 500 $\mu$m, the shielding sheets become too thick. Accordingly, it is the best to have the thickness of the insulation layers between 5-500 $\mu$m. When plural layers of amorphous alloy layers and electrical conductive metal layers are used, a plurality of the insulation layers should be used between the layers.

A metal plate, such as cooper, aluminum, nickel or iron, can be used as the electrical conductive metal layer. However, when the thickness of the metal plate is less than 5 $\mu$m, the shielding effect for waves of high frequency is not good and when the thickness exceeds 500 $\mu$m, the weight of the shielding sheet becomes too great. Thus the thickness of the conductive metal layer should be from 5-500 $\mu$m thick.

Also it is possible to use a metal net as the electrical conductive metal layer. When the mesh of the net is larger than 5, the shielding property of the sheet for waves of high frequency is not good because the voids become too large, and when the mesh size is smaller than 250 mesh the sheet becomes too expensive. Accordingly, the range of mesh size should be between 5-250 mesh, preferably 10-100 mesh. Excellent shielding properties are obtained with electromagnetic shielding sheets using a metal net layer, and they are easy to use because of their flexability.

Also, it is possible to use electrical conductive substances such as a plastic film (for example, polyester film) in place of the electrical conductive metal layer and the insulation layer. The shielding property for electromagnetic waves of high frequency is improved by the electrical conductive loss of the electrical conductive substance.

Figure 2:
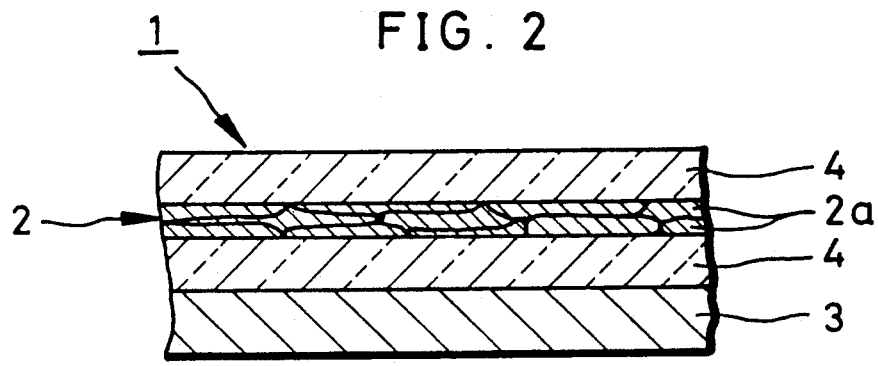
FIG. 2 is a cross-sectional view of an electromagnetic shielding sheet in an enlarged scale.

FIG. 2 shows an electromagnetic shielding sheet of the invention containing an amorphous alloy layer of amorphous alloy flakes, an electrical conductive metal layer and an insulation layer separating the two. More particularly, interposed between two polyester film layers 4 acting as an insulation layer is an amorphous alloy layer 2 having stacked thereon amorphous alloy flakes 2a. Further, an electrical conductive metal layer 3 such as a copper sheet is adhered to one of the polyester film layers 4. Accordingly, an electromagnetic shielding sheet 1 having four laminated layers is provided.

Figure 3:
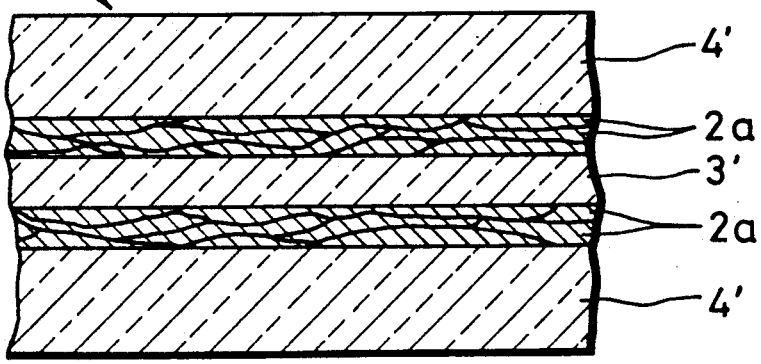
FIG. 3 is a cross-sectional view of a second embodiment of the sheet.

In FIG. 3, another electromagnetic shielding sheet 1 is shown wherein the laminated sheet is formed by locating an electrical conductive plastic film 3' between two amorphous alloy layers 2 having amorphous alloy flakes 2a and then interposing this structure between two plates 4' selected from glass, acryl resin, poly vinyl chloride, epoxy resin and phenol resin.

As shown in FIG. 1, the amorphous alloy flakes 2a of the amorphous alloy layer are uniformly dispersed and stacked in a random direction. Thus the amorphous alloy flakes have a non-directional property. If a directional property is needed, a magnetic field can be exerted on the amorphous alloy flakes when they are being dispersed.

The amorphous alloy flakes can be formed by cutting a ribbon of the alloy or by the melt-extraction method. It is preferable to use the cavitation method as shown in the Japanese Patent Laid open publication No. 58-6907, where the melted metals are supplied on a rolling surface having a low wetting property for the metals at high speed and the metals are dispersed to fine particles. Then the dispersed particles are run onto a rolling metal surface and quickly cooled. By this method amorphous alloy flakes having a thin thickness in the peripheral edges are easily obtained and productivity is good.

EXAMPLE 1

Amorphous alloy flakes having a composition of $Co_{69.8}Fe_{4.2}Si_{17}B_9$ (the numerals shown in the elements are atomic % of the elements) are formed by the above mentioned cavitation method. The average thickness of the amorphous alloy flakes is 40 $\mu$m, and the aspect ratio is 200-500.

An electromagnetic shielding sheet 1 as shown in FIG. 2 is formed, having one amorphous alloy layer 2 of the above described flakes and one copper plate as the metal layer 3. A polyester film 4 as an insulating layer having a thickness of 25 $\mu$m is laminated between copper plate 3 having a thickness of 100 $\mu$m and the amorphous alloy layer 2 on which are stacked the amorphous alloy flakes 2a at a rate of 250 g/m². The lamination is further coated with a polyester film 4 having a 25 $\mu$m thickness.

Figure 21:
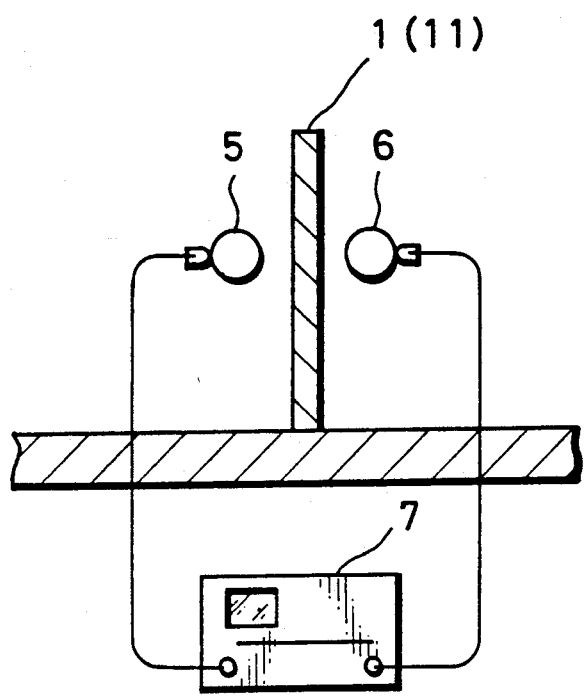
FIG. 21 illustrates a method for measuring the shielding effect of a sheet on electromagnetic waves of low frequency.
Figure 22:
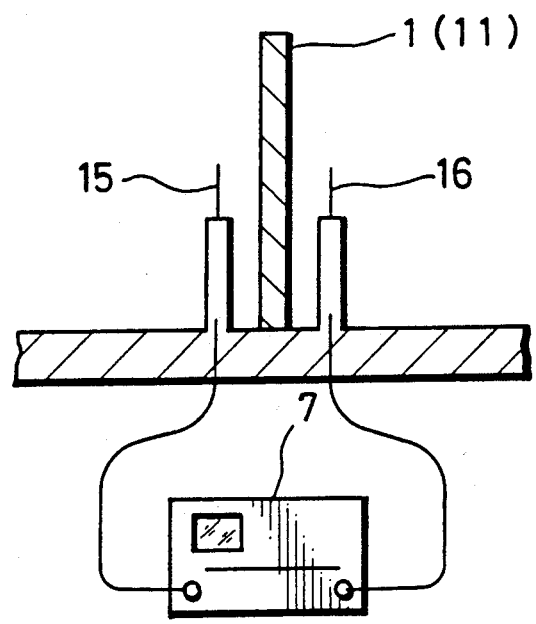
FIG. 22 illustrates a method for measuring the shielding effect of a sheet on electromagnetic waves of high frequency.

With respect to this electromagnetic shielding sheet, shielding properties are measured using a spectrum analyzer TR-4172 made by Advantest K.K. FIG. 21 illustrates the method for measuring its shielding properties with respect to low frequency waves and FIG. 22 the method for high frequency waves. The loop antenna 5 for transmission of magnetic waves having a diameter of 10 mm or the probe antenna 15 for electric wave transmissions having a length of 10 mm is placed at a distance of 10 mm on one side from the electromagnetic shielding sheet 1 having a size of 200 mm × 200 mm. The loop antenna 6 for receiving the magnetic waves and having a diameter of 10 mm or the probe antenna 16 receiving for receiving the electrical waves having a length of 10 mm is also placed at a distance of 10 mm from the electromagnetic shielding sheet 1 on the other side. The ends of these antenna are connected with the spectrum analyzer 7 (TR-4172) having a tracking generator. The damping magnetic wave or the damping electric wave from the transmission antenna 5 or 15 through the electromagnetic shielding sheet 1 is detected by reception antennae 6 or 16 and is measured by the spectrum analyzer.

Figure 4:
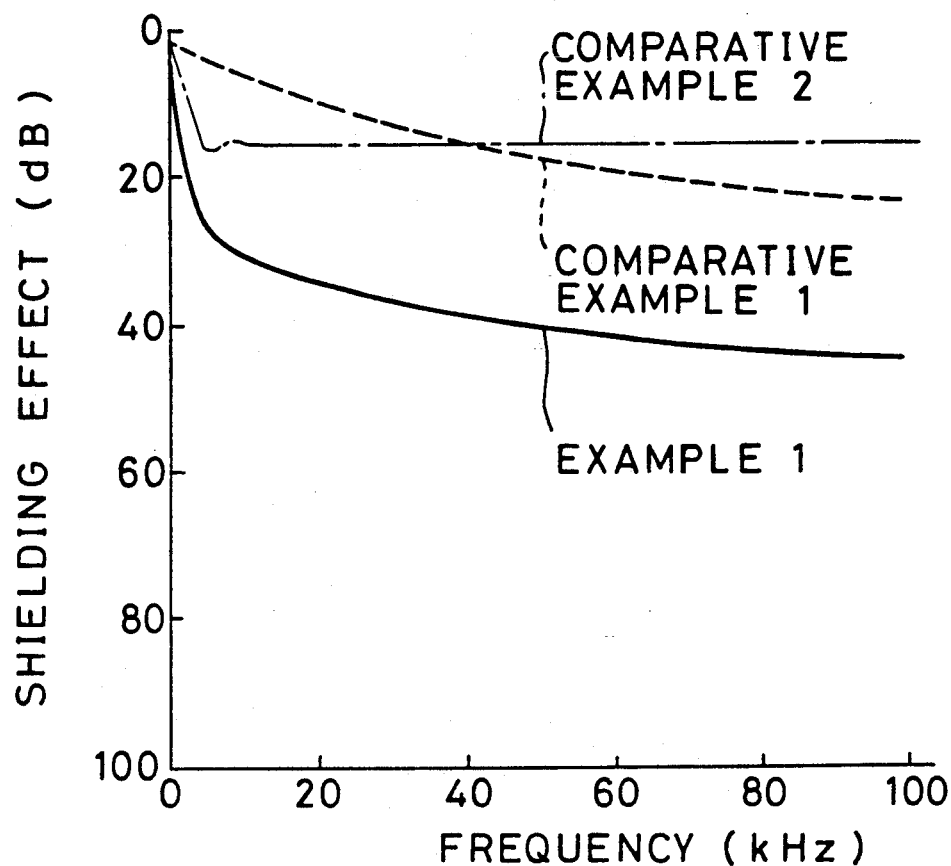
FIGS. 4, 5, 6 and 7 are graphs showing the relationships between frequency and shielding effect.
Figure 5:
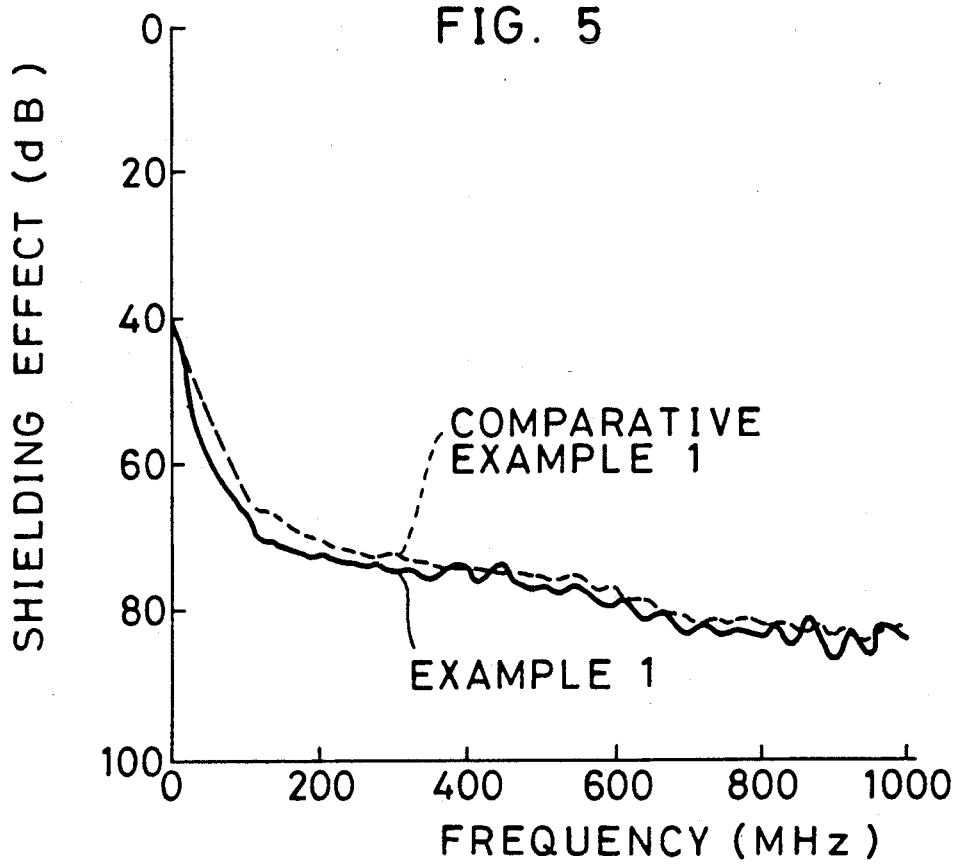

The measurement results are shown in FIGS. 4 and 5, and the shielding effects are shown as the absolute value dB. As control examples, the results of an electromagnetic shielding sheet consisting only of a copper plate of thickness 100 μm thickness (893 g/m², comparative example 1) and one consisting only of an amorphous alloy flake layer as described above but without a metal layer (comparative example 2) are also plotted in FIGS. 4 and 5 using the same test method. Only the results of comparative example 1 are shown in FIG. 5.)

EXAMPLE 2

Figure 6:
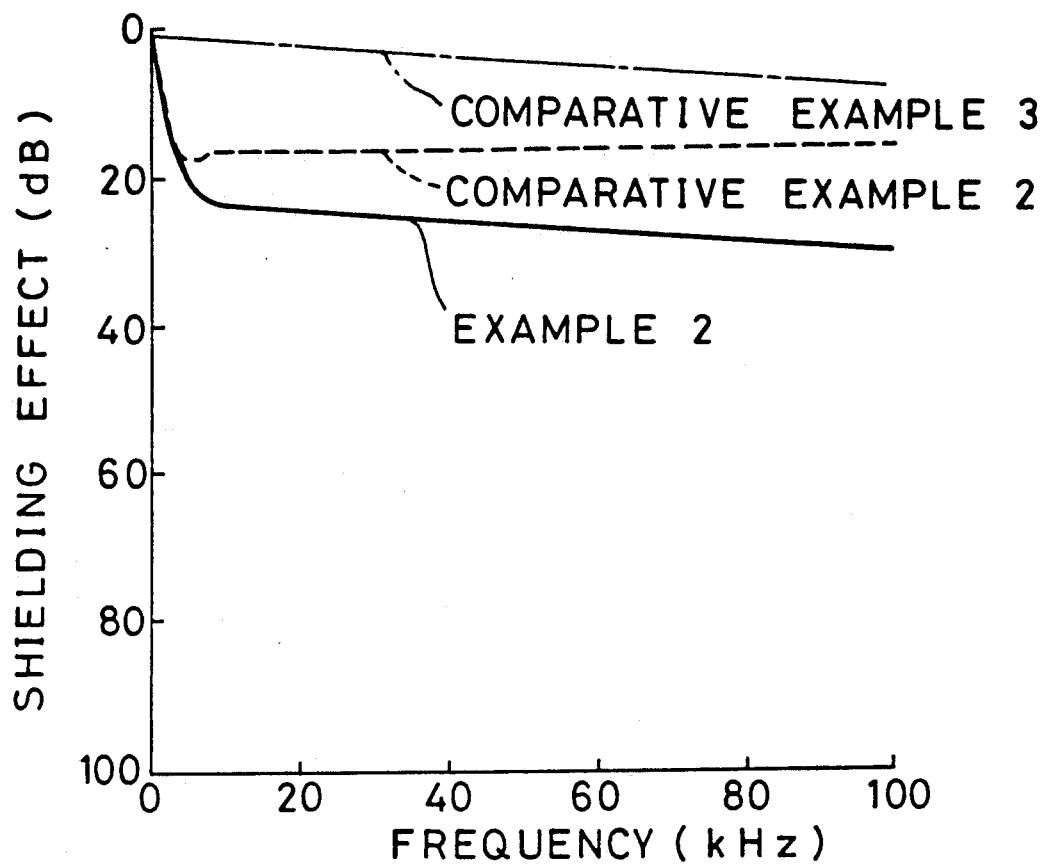
Figure 7:
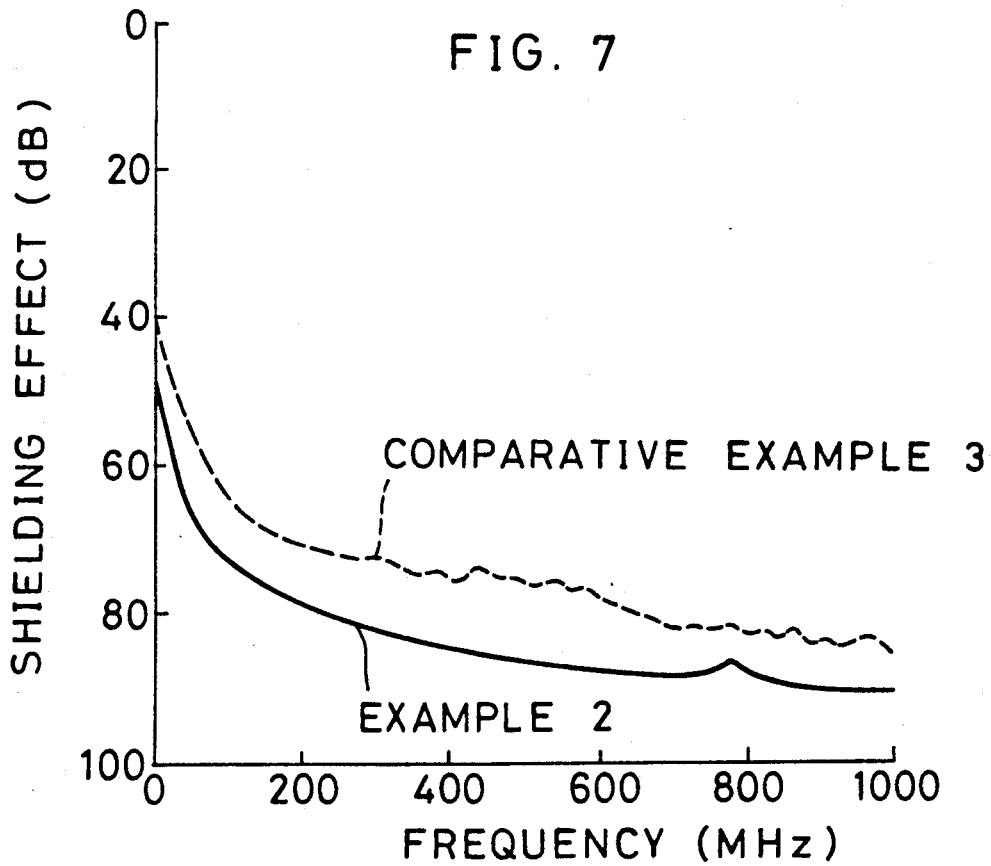

The same experiment as Example 1 is performed, wherein an aluminum foil having a thickness of 15 μm is used in place of the copper plate (3) in the shielding sheet (1) and alone as comparative example 3. The same measurements as Example 1 are performed. The test results are shown in FIGS. 6 and 7.

When the results of Examples 1 and 2 are compared with the comparative examples, wherein only an aluminum foil is used (comparative example 2) very good shielding effects are obtained by the sheets of Examples 1 and 2 for electromagnetic waves of low frequency from 10-100 KHz. Also the shielding effects for waves of high frequency of from 100 to 1000 MHz are the same or better compared to a copper plate or aluminum foil.

Thus good electromagnetic shielding properties of both low frequency and high frequency waves are achieved by the electromagnetic shielding sheets of this invention.

EXAMPLE 3

Figure 8:
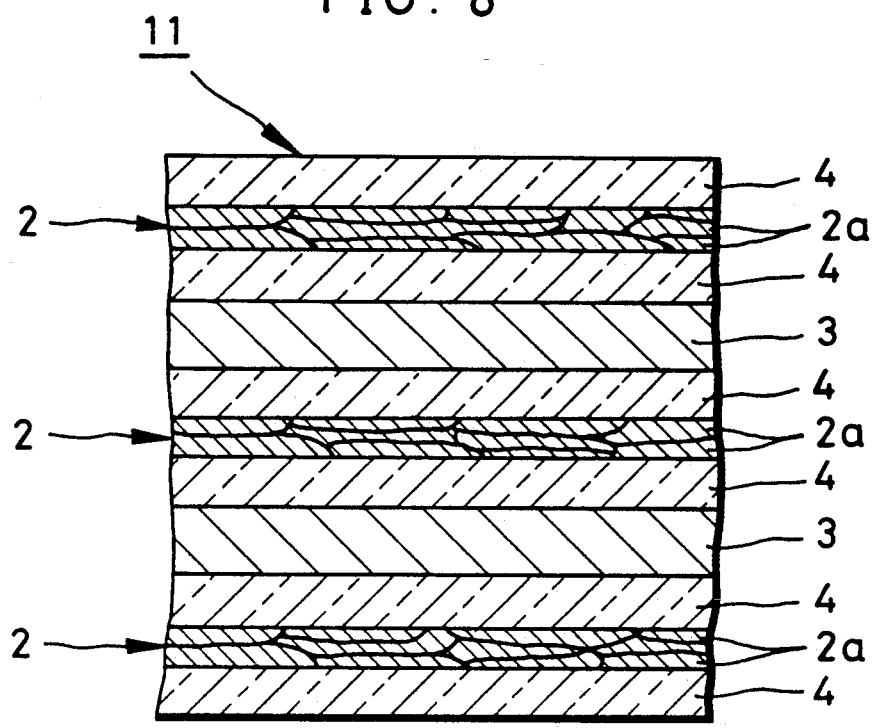
FIG. 8 is a cross-sectional view of a third embodiment of the sheet.

An electromagnetic shielding sheet (11) having a plurality of laminated structures is shown in FIG. 8. Here three amorphous alloy layers (2) and 2 metal layers (3) are used in which the metal layers (3) are separated from the amorphous alloy layers (2) by insulating polyester films (4) which films also form the lower and upper surfaces of the sheet. Thus there are six insulation layers.

Amorphous alloy flakes (2a) having a composition of $Co_{69.8}Fe_{4.2}Si_{17}B_9$, an average thickness of 40 μm and an aspect ratio of 200-500 are laminated at a rate of 250 g/m² to form the amorphous alloy layers (2). The metal layer (3) is a copper plate having a thickness of 100 μm and the thickness of the polyester films (4) is 25 μm.

Similar measurements as in Examples 1 and 2 are conducted of the shielding effect of this sheet with respect to electromagnetic waves of low frequency.

Figure 9:
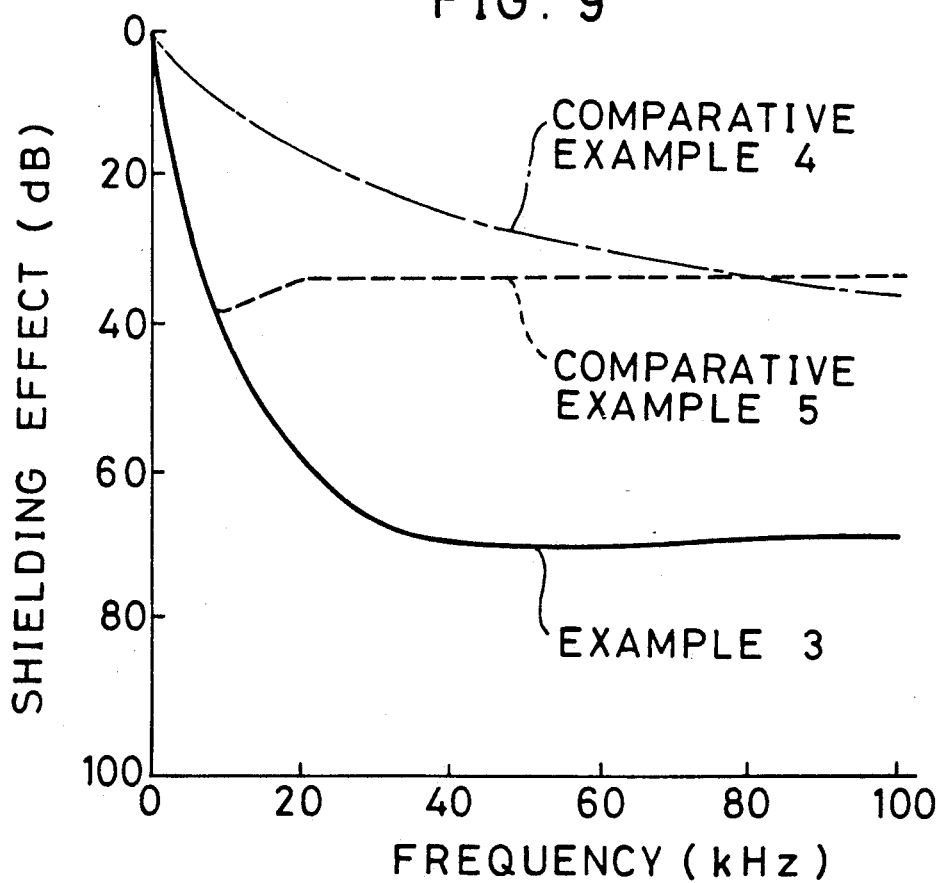
FIGS. 9, 10, 11, 12, and 13 are graphs showing the relationships between frequency and shielding effect.

The results are shown in FIG. 9. For comparison, the results of a sheet of two copper plates (comparative example 4) and one having polyester films as upper and lower surfaces and polyester films between the three amorphous alloy layers but without any copper plate layers (comparative example 5) are also shown in FIG. 9.

As shown in FIG. 9, when the results of the sheet of Example 3 are compared with the results of comparative examples 4 and 5, the electromagnetic shielding effect is remarkably improved in the area of low frequency. Further the shielding property is better than that obtained from the sheets of Examples 1 and 2 which are shown in FIGS. 4 and 6. While the shielding property of the sheet of comparative example 5 is good for low frequency, but it would be low for high frequency because there is no metal layer.

EXAMPLE 4

Amorphous alloy flakes having a composition of $Co_{69.8}Fe_{4.2}Si_{17}B_9$ are formed by the above described cavitation method. The amorphous alloy flakes have an average thickness of 30 μm and the aspect ratio is from 400-600.

Using these amorphous alloy flakes, an electromagnetic shielding sheet (1) is formed having one amorphous alloy layer as shown in FIG. 2 and one copper net layer 3 having a 13-20 mesh size. A polyester film (4) having a thickness of 25 μm is laminated between the copper net layer and the amorphous alloy flakes which are laminated onto each other at a rate of 250 g/m². A polyester film having a thickness of 25 μm is coated on the upper outside surface.

The electromagnetic shielding properties of this electromagnetic shielding sheet (1) is measured using the spectrum analyzer TR-4172 as described in Example 1.

Figure 10:
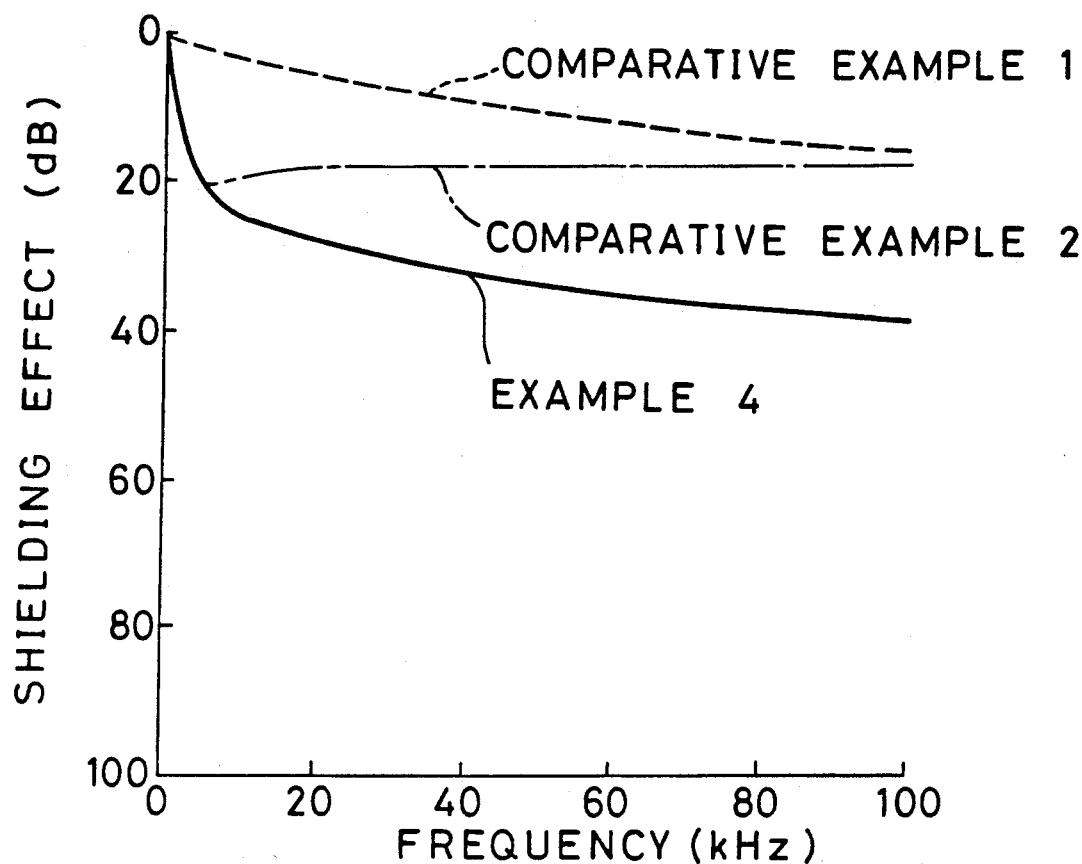
Figure 11:
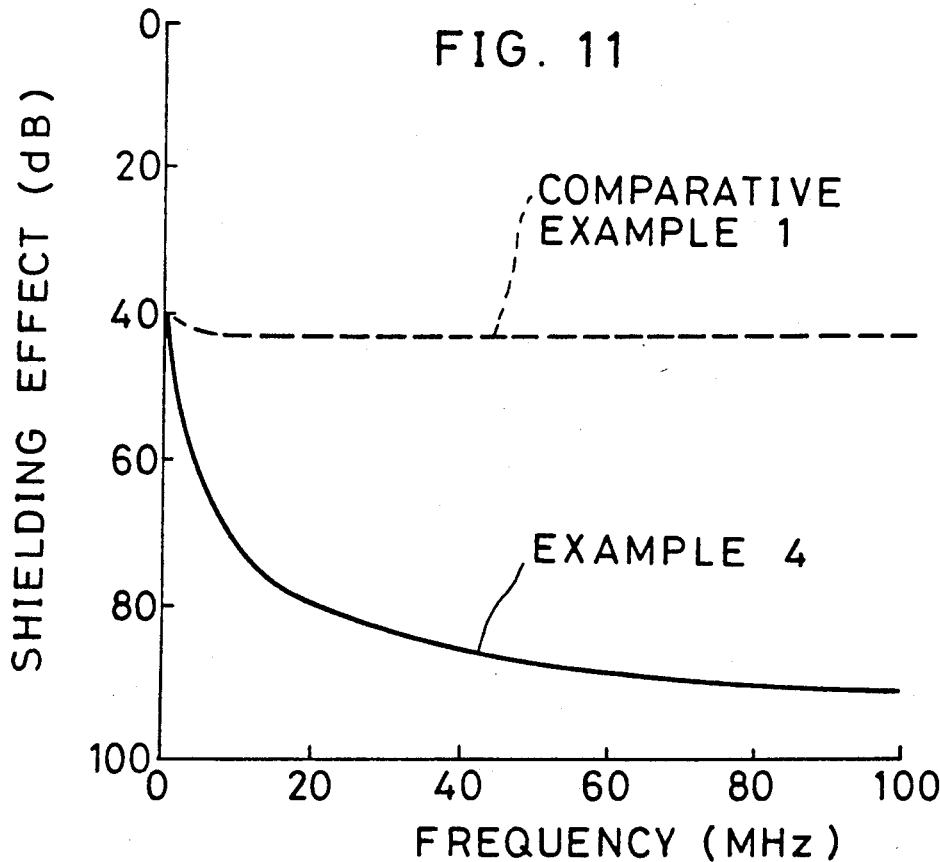

The results are shown in FIG. 10 and 11. The shielding effects are shown as the absolute value dB in those Figs. As comparative examples, the electromagnetic shielding effects of the same copper net metal sheet alone (comparative example 1) and the same amorphous alloy layer alone (comparative example 2) are measured.

EXAMPLE 5

An electromagnetic shielding sheet is formed, wherein the amorphous alloy flakes of Examples 4 are changed to an average thickness of 40 μm and the aspect ratio is from 200-500. The flakes are laminated at a rate of 300 g/m².

The metal sheet is changed to a copper mesh sheet of 80 mesh, and the amorphous alloy layer and the metal sheet are laminated to a polypropylene film having a thickness 50 μm located between the two layers. The other conditions are the same as that of Example 4.

Figure 12:
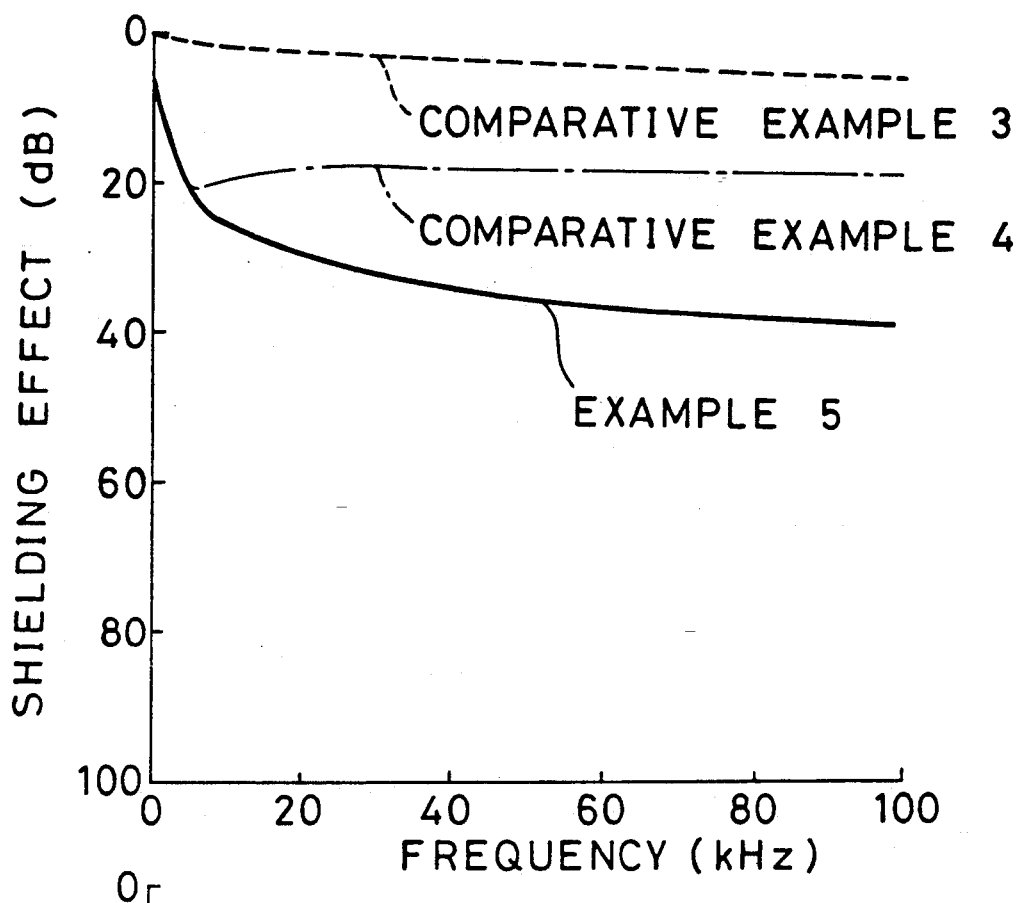
Figure 13:
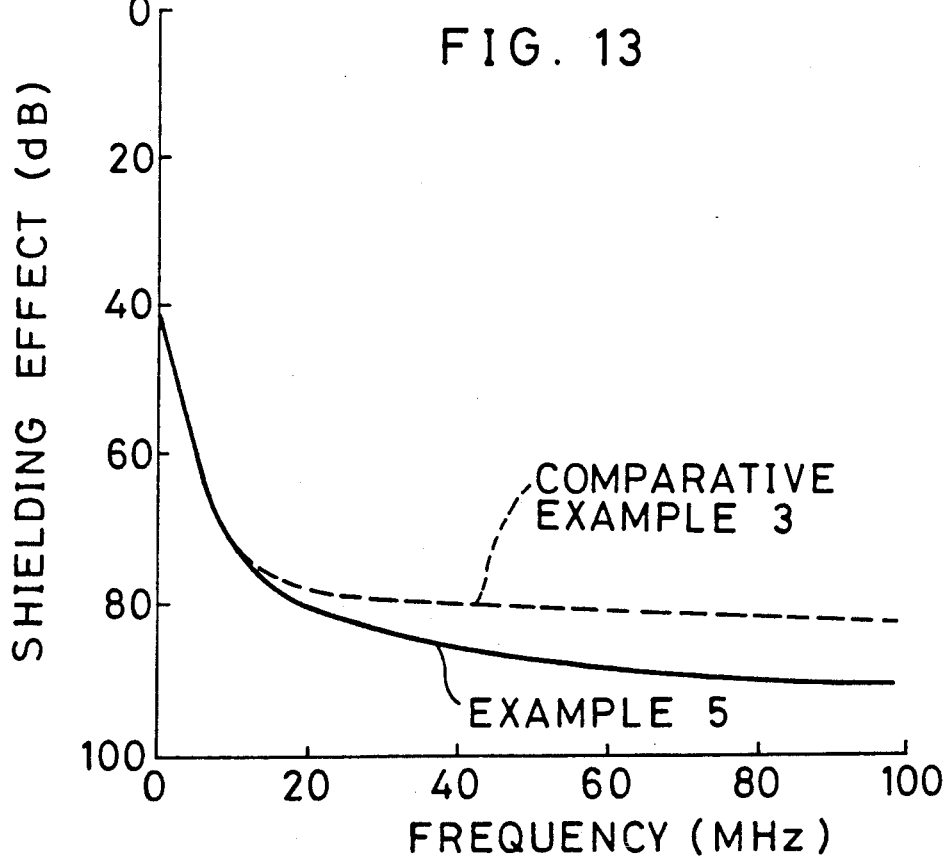

FIGS. 12 and 13 illustrate the results of measuring the shielding effects of this sheet. The results obtained from a shielding sheet having a copper net (comparative example 3) and one having the same amorphous alloy layer 5 but no metal sheet (comparative 4) are also shown in FIGS. 12 and 13.

As shown in FIGS. 10-13, excellent electromagnetic shielding properties are obtained in both low and high frequencies by the sheets of Examples 4 and 5.

EXAMPLE 6

Figure 14:
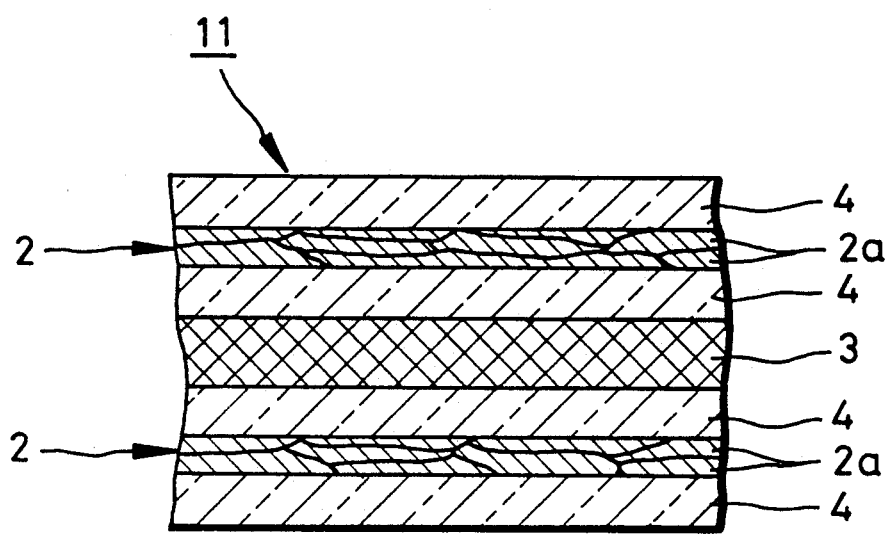
FIG. 14 is a cross-sectional view of a fourth embodiment of the sheet.

As shown in FIG. 14, an electromagnetic shielding sheet (11) having seven layers is formed, wherein two amorphous alloy layers (2) containing amorphous alloy flakes (2a) deposited at a rate of 250 g/m$^2$ are formed the same as Example 4. A copper net metal sheet (3) and two polyester films (4, 4), which are the same as Example 4, are placed between the two amorphous alloy layers as shown in FIG. 14 and two layers of the same polyester film are laminated to the outer surfaces.

Figure 15:
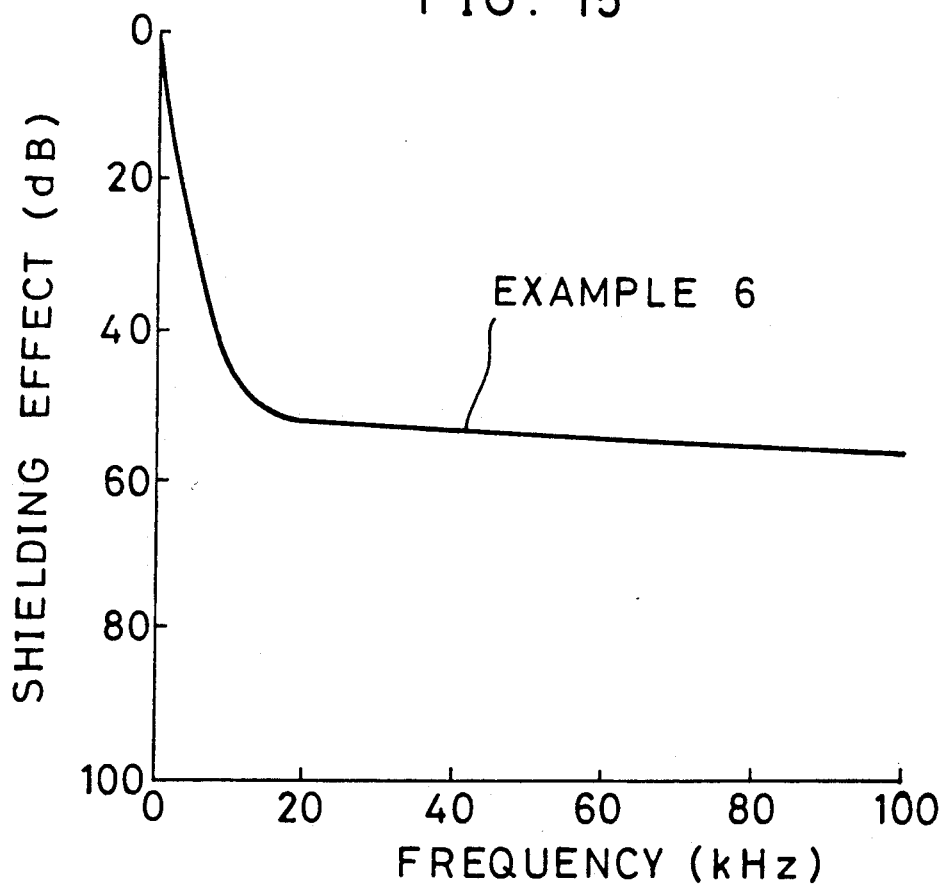
FIGS. 15 and 16 are graphs showing the relationships between frequency and shielding effect.
Figure 16:
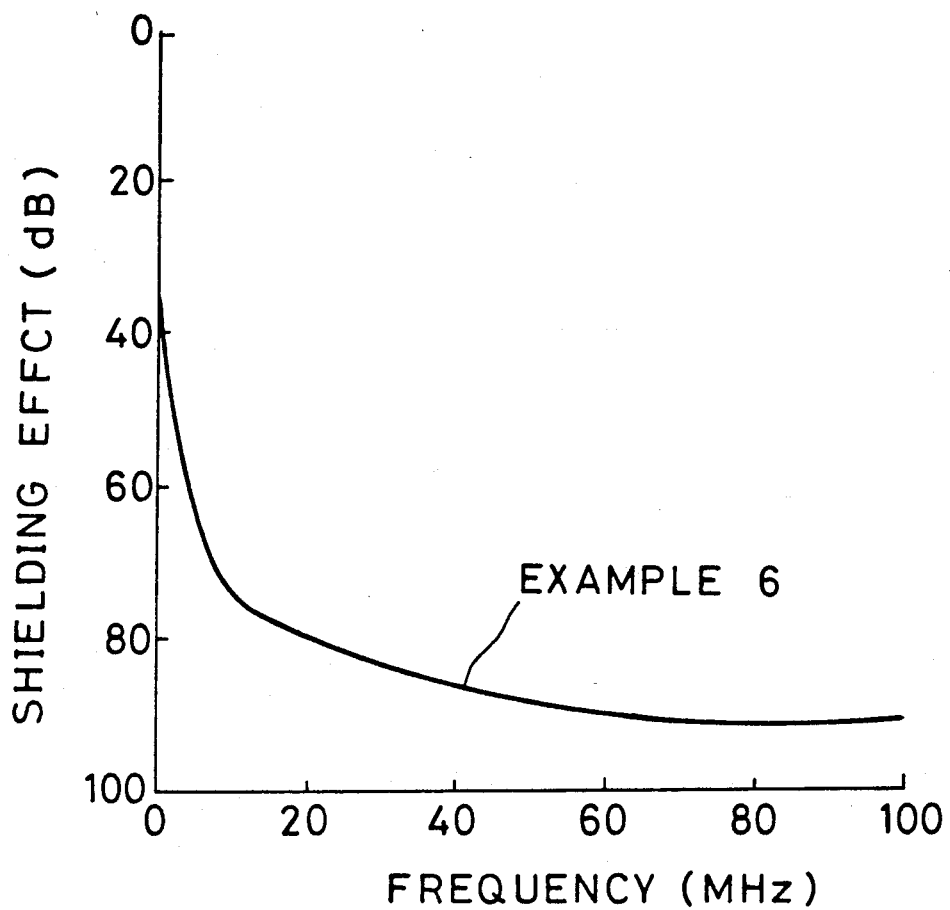

The same measurements are conducted and the results are shown in FIGS. 15 and 16.

In this Example, better magnetic shielding properties are obtained than those of Examples 4 and 5 for low frequency waves.

As the electromagnetic shielding sheets of Examples 4-6 use a metal net sheet, the sheets are flexible and convenient in use.

EXAMPLE 7

Amorphous alloy flakes having a composition of $Co_{69.8}Fe_{4.2}Si_{17}B_9$ are formed by the cavitation method. The average thickness of the amorphous allow flakes is 30 $\mu$m, and the aspect ratio is from 400-600.

Figure 17:
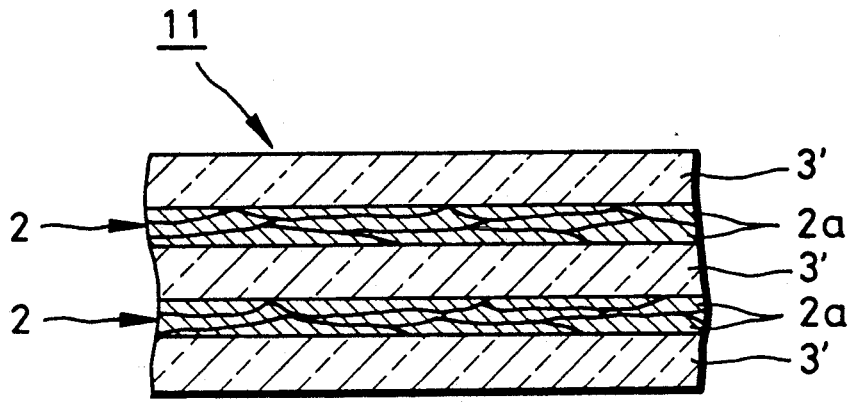
FIG. 17 is a cross-sectional view of a fifth embodiment of the sheet.

As shown in FIG. 17, the electromagnetic shielding sheet (11) has two amorphous alloy layers (2) formed by using these amorphous alloy flakes and a polyester film (3') having a thickness of 50 $\mu$m is located between the amorphous alloy layers. The amorphous allow flakes (2a) are deposited at a rate of 250 g/m$^2$. Further a polyester film 3' is laminated to either side of the alloy layers.

The amorphous alloy layers and polyester films (3') are fixed to each other by an adhesive (not shown). Here the same polyester film used as the intermediate layer (3') is used in the outside layers instead of the outside plate layer (4') of the electromagnetic shielding sheet shown in FIG. 3.

The electromagnetic shielding properties are measured using the spectrum analyzer TR-64172 as described in Example 1.

Figure 18:
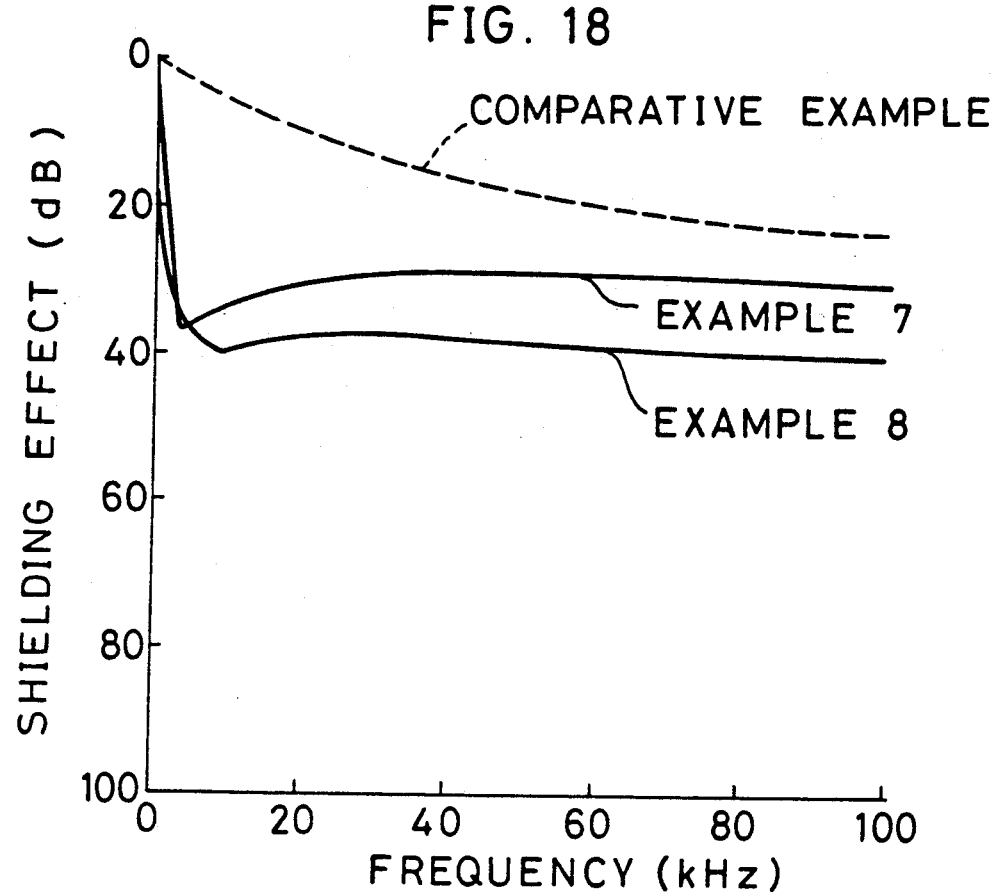
FIGS. 18 and 19 are graphs showing the relationships between frequency and shielding effect.
Figure 19:
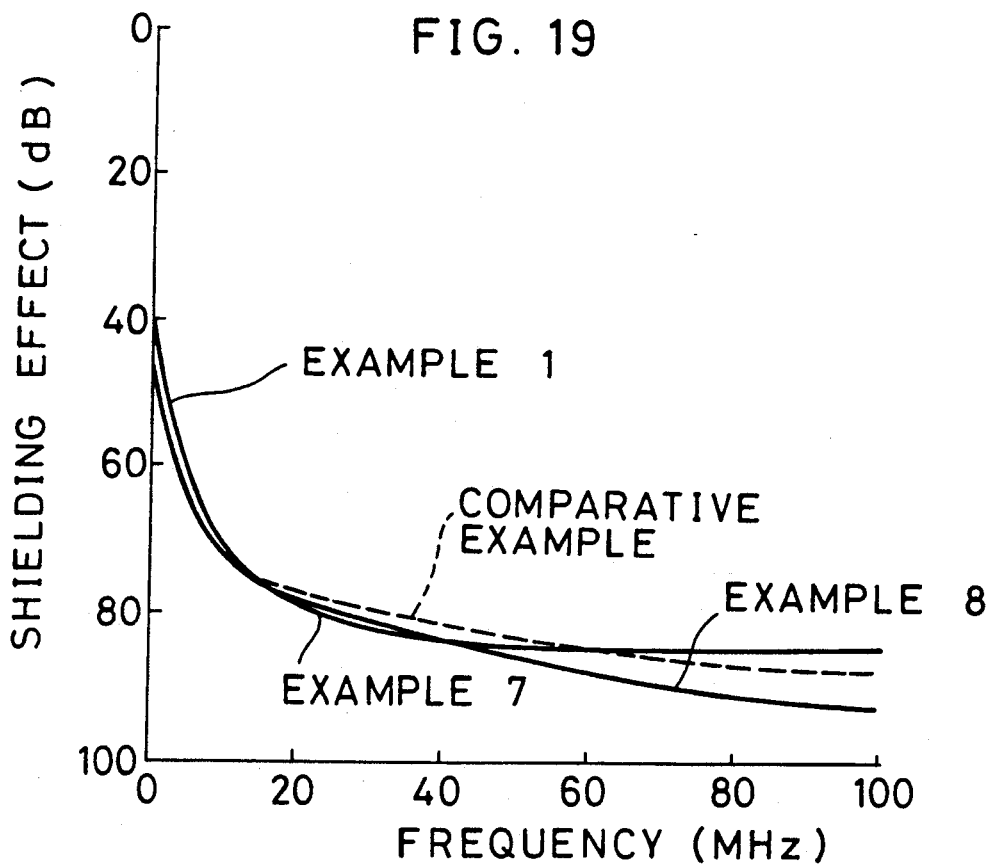

The results are shown in FIGS. 18 and 19, and the shielding effects are shown as the absolute value dB. As a control example, the results of an electromagnetic shielding sheet having a copper plate of 100 $\mu$m (893 g/m$^2$, comparative example) are also shown in FIGS. 18 and 19.

EXAMPLE 8

Figure 20:
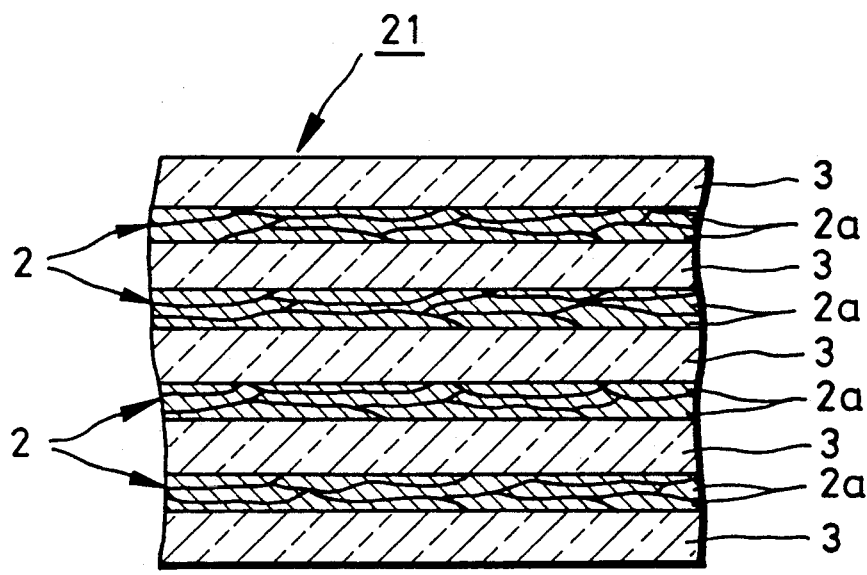
FIG. 20 is a cross-sectional view of a sixth embodiment of the sheet.

As shown in FIG. 20, an electromagnetic shielding sheet (21) having 4 layers (2) of amorphous alloy flakes 2a having a composition of $Co_{69.8}Fe_{4.2}Si_{17}B_9$, an aspect ratio of 400-600 and deposited at a rate of 250 g/m$^2$ is formed, and five polyester film layers (3) having a thickness of 25 $\mu$m are located between each amorphous alloy layer and on the outside surfaces. The other specifics are the same as Example 7.

The electromagnetic shielding properties of this sheet (21) are measured and the results are also shown in FIGS. 18 and 19.

When compared with a copper plate, in the low frequency range of 10-100 KHz very good shielding effects are obtained by the sheets of Examples 7 and 8. Also the same or better shielding effects as a copper plate are achieved in the high frequency range of 1-100 MHz. Thus good electromagnetic shielding properties from electromagnetic waves of low frequency and high frequency are achieved.

We claim:

1. An electromagnetic shielding sheet comprising at least one amorphous metal alloy layer made up of soft magnetic Co based amorphous alloy flakes of $Co_{69.8}Fe_{4.2}Si_{17}B_9$, at least one electrical conductive metal layer and at least one insulation layer laminated between said metal layer and said alloy layer, said amorphous alloy flakes each having a thickness of from 5 to 100 $\mu$m, an aspect ratio of from 10 to 15,000 and being laminated onto each other to form said alloy layer at a rate of from 100 to 500 g/m$^2$ and said electrical conductive metal layer being selected from a metal of the group consisting of Cu, Al, Ni and Fe and having a thickness of from 5 to 500 $\mu$m.

2. The electromagnetic shielding sheet of claim 1, wherein said electrical conductive metal layer is an electrical conductive metal net having a mesh size of from 5 to 250 mesh.

3. The electromagnetic shielding sheet of claim 1, wherein said electroconductive metal layer is a copper plate.

4. The electromagnetic shielding sheet of claim 1, wherein the electroconductive metal layer is a sheet of aluminum foil.

5. The electromagnetic shielding sheet of claim 1, comprising a plurality of Co based amorphous metal alloy flake layers and a plurality of insulation layers laminated to the upper and lower sides of each alloy layer.

6. The electromagnetic shielding sheet of claim 1, wherein said amorphous alloy flakes have a thickness of from 20 to 60 $\mu$m, an aspect ratio from 50 to 10,000 and are laminated onto each other to form said alloy layer at a rate of from 200 to 350 g/m$^2$.

7. An electromagnetic shielding sheet comprising at least one amorphous metal alloy layer made up of soft magnetic Co based amorphous alloy flakes of $Co_{69.8}Fe_{4.2}Si_{17}B_9$ and an electrically conductive plastic film layer laminated to the upper and lower sides of said alloy layer, said amorphous alloy flakes each having a thickness of from 5 to 100 $\mu$m, an aspect ratio of 10 to 15,000 and being laminated onto each other to form said alloy layer at a rate of from 100 to 500 g/m$^2$, the plastic film layers having a thickness of from 5 to 500 $\mu$m.

8. The electromagnetic shielding sheet of claim 7, wherein said amorphous alloy flakes have a thickness of from 20 to 60 $\mu$m, an aspect ratio of from 50 to 10,000 and are laminated onto each other to form said alloy layer at a rate of from 200 to 350 g/m$^2$.

* * * * *

UNITED STATES PATENT AND TRADEMARK OFFICE
CERTIFICATE OF CORRECTION

PATENT NO. : 5,260,128
DATED : November 9, 1993
INVENTOR(S) : Hiroyoshi ISHII and Misao KANEKO It is certified that error appears in the above-indentified patent and that said Letters Patent is hereby corrected as shown below:

Claim 6, column 8, line 43, after "ratio" insert --of--.

Signed and Sealed this

Twenty-sixth Day of April, 1994

BRUCE LEHMAN

Attest:

Attesting Officer

Commissioner of Patents and Trademarks